United States Patent [19]
Watanabe

[11] Patent Number: 5,338,947
[45] Date of Patent: Aug. 16, 1994

[54] AVALANCHE PHOTODIODE INCLUDING A MULTIPLICATION LAYER AND A PHOTOABSORPTION LAYER

[75] Inventor: Isao Watanabe, Tokyo, Japan

[73] Assignee: Nec Corporation, Tokyo, Japan

[21] Appl. No.: 993,706

[22] Filed: Dec. 21, 1992

[30] Foreign Application Priority Data

Dec. 20, 1991 [JP] Japan .................. 3-338651

[51] Int. Cl.$^5$ ...................... H01L 27/14; H01L 31/00
[52] U.S. Cl. ...................... 257/186; 257/15; 257/21; 257/438
[58] Field of Search ............. 257/15, 21, 186, 438, 257/14

[56] References Cited

U.S. PATENT DOCUMENTS 5,187,553  2/1993  Makita ................. 257/187
5,204,539  4/1993  Tsuji et al. ............ 257/186

FOREIGN PATENT DOCUMENTS 3-227074  10/1991  Japan ................ 257/186

OTHER PUBLICATIONS

F. Capasso et al., "Enhancement of electron impact ionization in a superlattice; A new avalanche photodiode with a large ionization rate ratio," *Appl. Phys. Lett.* 40(1), Jan. 1, 1982, pp. 38–40.

T. Kagawa ewt al., "Impact ionization rates in an In-GaAs/InAlAs superlattice," *Appl. Phys. Lett.* 55(10), Sep. 4, 1989, pp. 993–995.

*Primary Examiner*—Rolf Hille
*Assistant Examiner*—Minhlcan Tran
*Attorney, Agent, or Firm*—Burns, Doane, Swecker & Mathis

[57] ABSTRACT

An avalanche photodiode includes a multiplication layer and a photoabsorption layer, and the multiplication layer is formed of a semiconductor superlattice structure composed of a number of well layers each of which is formed of a short period superlattice of at least two kinds of semiconductors and which can be equivalently regarded to be a mixed crystal of the at least two kinds of semiconductors. In the short period superlattice, the mini-bands are formed within the superlattice well layers having its effective forbidden band width, which is larger than the forbidden band width in a bulk condition of a semiconductor layer constituting a well in the short period superlattice. Thus, the dark current due to the inter-band tunnel transition within the same well layer is decreased. Therefore, a low noise characteristics and a low noise and high response speed characteristics obtained by a high ionization rate ration can be simultaneously realized.

7 Claims, 2 Drawing Sheets

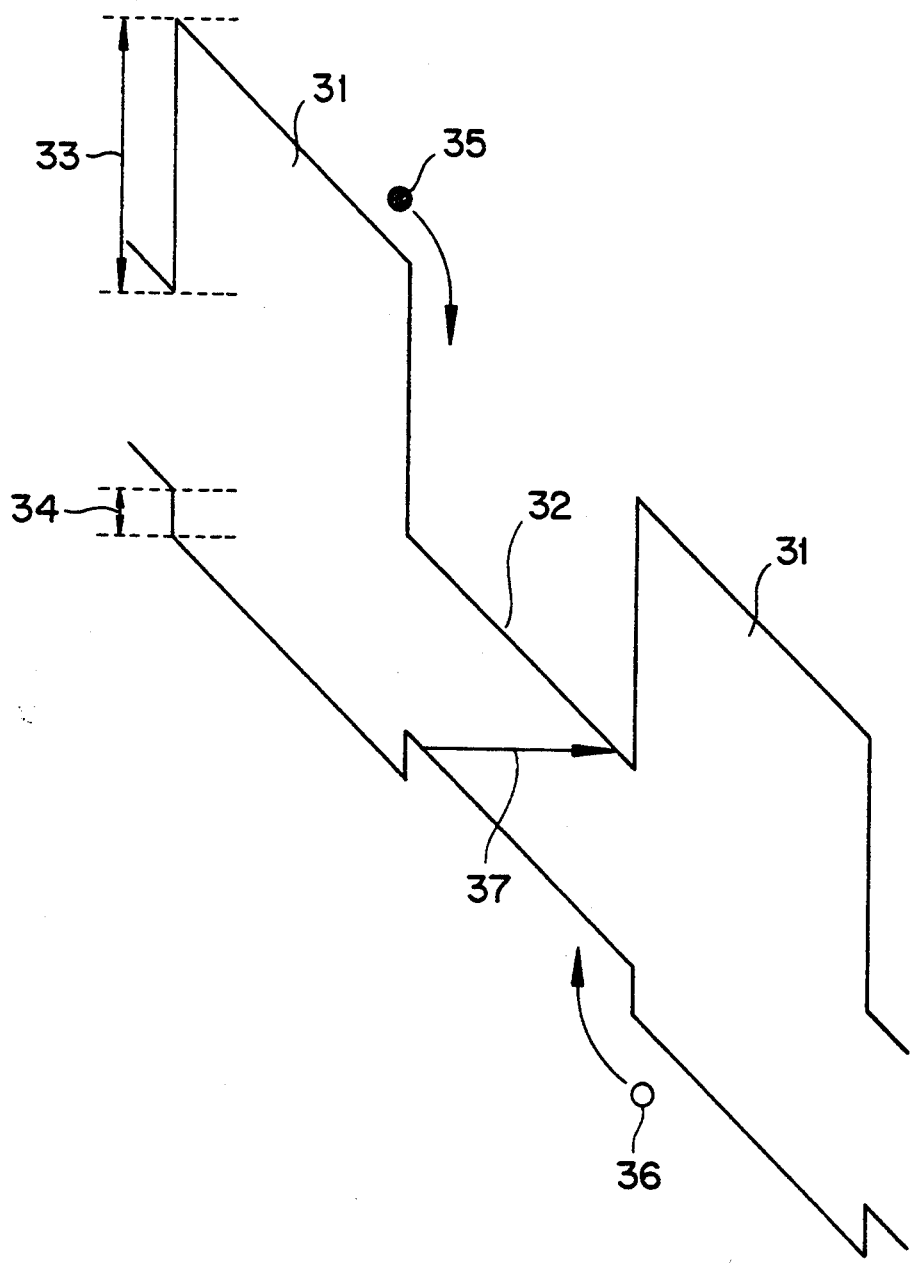

AVALANCHE PHOTODIODE INCLUDING A MULTIPLICATION LAYER AND A PHOTOABSORPTION LAYER

BACKGROUND OF THE INVENTION

1. Field of the Invention

The present invention relates to a semiconductor photosensor, and more specifically to an avalanche photodiode of a low noise, low dark current, and high speed response characteristics.

2. Description of Related Art

To realize a high-speed, large-capacity optical transmission system, semiconductor photosensors of a low noise, low dark current, and high speed response characteristics are indispensable. Recently, for this purpose, a research for increasing the response speed and sensitivity of an InP/InGaAs avalanche photodiode which can be used in a low loss wavelength region of 1.3 μm to 1.6 μm of a silica optical fiber, is actively made. In this InP/InGaAs avalanche photodiode, a gain bandwidth product of 75 GHz has been realized by decreasing a receiving aperture diameter so as to reduce the capacitance, by optimizing the layer thickness for reducing the carrier transit time, and by introducing an intermediate layer at a heterojunction interface for controlling a carrier trap.

In the above mentioned InP/InGaAs avalanche photodiode, however, since the ionization rate ratio $\alpha/\beta$ (where $\alpha$ is an electron ionization rate and $\beta$ is a hole ionization rate) is as small as 2 or less, the excess noise factor "x" becomes as large as 0.7 or less (because, the smaller the ionization rate ratio is, the larger the excess noise factor is). Therefore, there is a limit in realizing the low noise and the high sensitivity. This can also applied in the case that the avalanche multiplication layer is formed of other bulk III-V group compound semiconductor. Therefore, for realizing the low noise and the high gain bandwidth product (high speed response), it is necessary to artificially increase the ionization rate ratio $\alpha/\beta$.

Thus, F. Capasso et al proposed, in Appl. Phys. Lett., Vol. 40(1), pp 38-40, 1982, a structure in that the ionization rate ratio $\alpha/\beta$ is artificially increased by utilizing a conduction bank energy discontinuity amount $\Delta E_c$ in the superlattice for impact ionization of electrons. It was actually confirmed that the ionization rate ratio $\alpha/\beta$ is increased in GaAs/GaAlAs superlattice structure ($\alpha/\beta$ was increased to 8 at maximum in the superlattice, in comparison to 2 at maximum in a bulk GaAs). In addition, Kagawa et al reported, in Appl. Phys. Lett., Vol. 55(10), pp 993-995, 1989, that a similar structure was formed in an InGaAs/InAlAs superlattice having a light receiving sensitivity in a band of the wavelength 1.3 μm to 1.6 μm, which is used in a long distance light communication, and the increase of the ionization rate ratio $\alpha/\beta$ was similarly confirmed ($\alpha/\beta$ was increased to 10 at maximum in the superlattice, in comparison to 2 at maximum in a bulk InGaAs).

More specifically, the Kagawa et al structure, the avalanche multiplication layer is formed of an alternating repetition of n$^-$ $In_{0.52}Al_{0.48}As$ barrier layers, and n$^-$ $In_{0.53}Ga_{0.47}As$ well layers, which form a superlattice avalanche multiplication layer.

In this structure, a conduction band energy discontinuity amount $\Delta E_c$ is 0.5eV which is larger than a valence band energy discontinuity amount $\Delta E_v$ of 0.2eV. Therefore, when the carriers enter in the well, the energy acquired due to the band discontinuity is larger in the electron than in the hole, so that the electron becomes easy to reach an ionization threshold energy. Thus, the electron ionization rate is increased, and the ionization rate ratio $\alpha/\beta$ is correspondingly increased.

In the above mentioned structure of avalanche photodiode, however, a tunnel dark current occurring in the well layers (n$^-$ $In_{0.53}Ga_{0.47}As$ well layer) having a short valence band width within the superlattice avalanche multiplication layer, extremely increases to a micro-ampere order, in a practical use region in which the multiplication factor is a few times or more.

SUMMARY OF THE INVENTION

Accordingly, it is an object of the present invention to provide a avalanche photodiode which has overcome the above mentioned defect of the conventional one.

Another object of the present invention is to provide a avalanche photodiode having a receiving sensitivity in the band of the 1.3 μm–1.6 μm wavelength and a high ionization rate ratio $\alpha/\beta$ and also having not only a low noise and high speed response characteristics but also a low dark current.

The above and other objects of the present invention are achieved in accordance with the present invention by an avalanche photodiode including a multiplication layer and a photoabsorption layer, the multiplication layer being formed of a semiconductor superlattice structure composed of a number of well layers each of which is formed of a short period superlattice of at least two kinds of semiconductors and which can be equivalently regarded to be a mixed crystal of the at least two kinds of semiconductors.

In a preferred embodiment, the semiconductor superlattice structure is composed of an alternating stacked structure of semiconductor barrier layers and short period superlattice layers, the short period superlattice layers being at least two kinds of semiconductors and which can be equivalently regarded to be a mixed crystal of the at least two kinds of semiconductors, the at least two kinds of semiconductors includes a first kind of superconductor constituting a barrier layer in the short period superlattice layer and a second kind of superconductor constituting a well layer in the short period superlattice layer.

For example, each of the semiconductor barrier layers and the short period superlattice layers has a thickness of not less than 50 Å. In addition, each second kind of superconductor has a thickness of not greater than 20 Å.

More preferably, each of the semiconductor barrier layers is formed of an $In_{0.52}Al_{0.48}As$ barrier layer having a thickness of 150 Å, and Each of the short period superlattice layers is formed in a four-period structure composed of three first kind of superconductor layers each formed of an $In_{0.52}Al_{0.48}As$ layers having a thickness of 10 Å and four second kind of superconductor layers each formed of an $In_{0.53}Ga_{0.47}As$ layer having a thickness of 20 Å.

The above and other objects, features and advantages of the present invention will be apparent from the following description of preferred embodiments of the invention with reference to the accompanying drawings.

BRIEF DESCRIPTION OF THE DRAWINGS

FIG. 3 is an energy band diagram of the superlattice multiplication layer in the conventional avalanche photodiode.

DESCRIPTION OF THE PREFERRED EMBODIMENTS

Figure 1A:
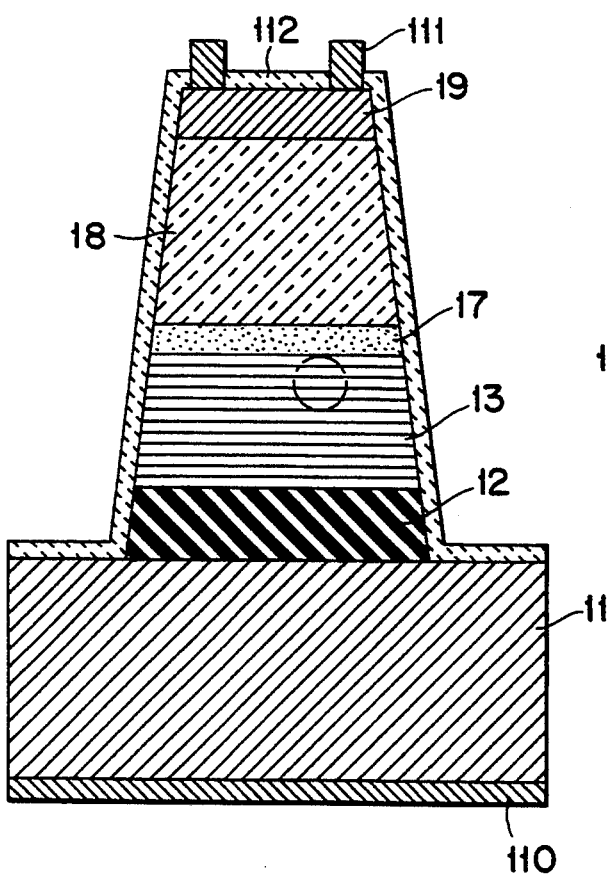
FIG. 1 is a diagrammatic sectional view of an embodiment of the avalanche photodiode in accordance with the present invention.
Figure 1B:
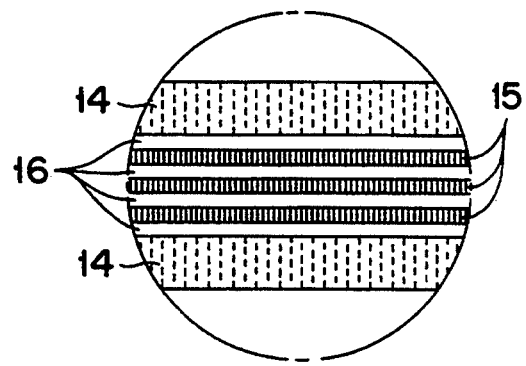

Referring to FIG. 1, there is shown a diagrammatic sectional view of an embodiment of the avalanche photodiode in accordance with the present invention.

The shown embodiment includes an $n^+$ semiconductor substrate 11, on which an n-type buffer layer 12 and $n^-$ superlattice avalanche multiplication layer 13 are formed in the named order. The $n^-$ superlattice avalanche multiplication layer 13 is composed of a plurality of semiconductor barrier layers 14, a first kind of super-, conductor layers 15 each constituting a well layer in the superlattice structure, and a second kind of superconductor layers 16 each constituting a well layer in the superlattice structure. These layers 14, 15 and 16 are stacked in such a manner that a unitary superlattice structure is composed of a few superconductor layers 15 of the first kind and a few superconductor layers 16 of the second kind alternately stacked one on another, and a plurality of unitary superlattice structures and the semiconductor barrier layers 14 are alternately stacked one on another.

On the $n^-$ superlattice avalanche multiplication layer 13, there are formed a p-type wide cap electric field drop layer 17, a $p^-$ photoabsorption layer 18, and a $p^+$ cap layer 19 in the named order. In addition, an n-side electrode 110 is formed on a rear surface of the substrate 11, and a p-side electrodes 111 are formed on the cap layer 19. An insulating protection layer 112 is formed to cover a top surface and a side surface of the multi-layer stacked structure, and an upper surface of the substrate 11.

Figure 2:
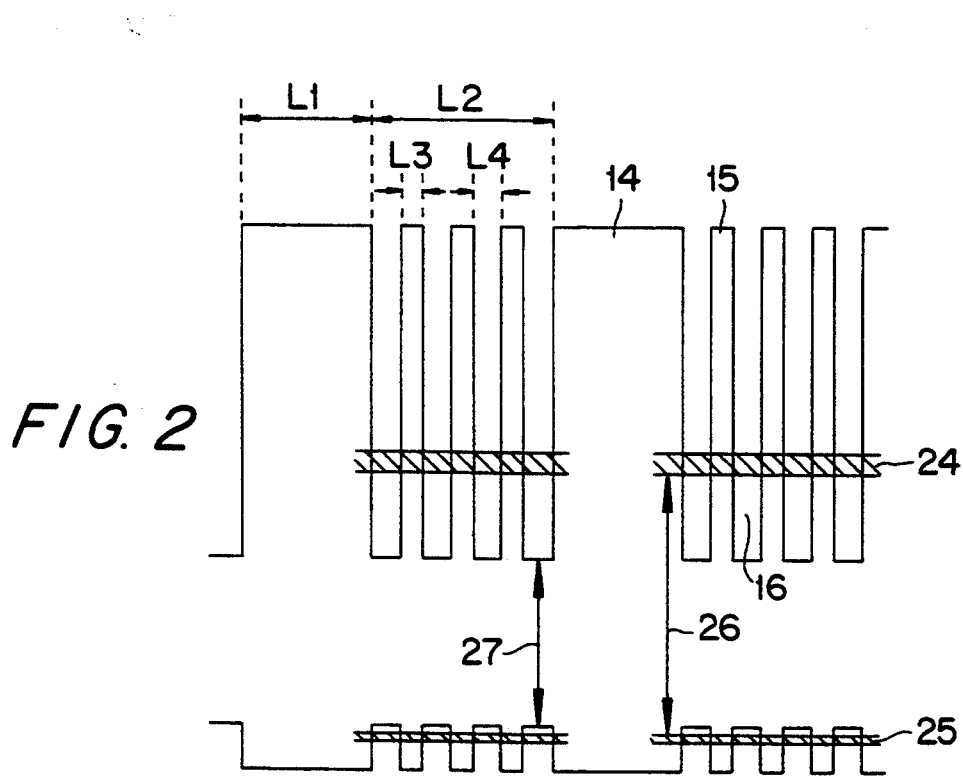
FIG. 2 is an energy band diagram of the superlattice multiplication layer in the avalanche photodiode shown in FIG. 1.

Turning to FIG. 2, there is shown an energy band diagram of the superlattice multiplication layer in the avalanche photodiode shown in FIG. 1. In FIG. 2, the same elements as those shown in FIG. 1 are given the same Reference Numerals. In addition, Reference Numeral 24 designates a mini-band or sub-band of electrons, and Reference Numeral 25 designates a mini-band or sub-band of holes. Reference Numeral 26 indicates an effective forbidden band width of the well layer, and Reference Numeral 27 shows a forbidden band width in a bulk condition of the second kind of semiconductor layer 16.

Here, referring to FIG. 3, there is shown an energy band diagram when the avalanche multiplication layer is biased in the Kagawa et al structure as mentioned hereinbefore. In FIG. 3, Reference Numeral 31 designates an $n^-$ $In_{0.52}Al_{0.48}As$ barrier layer, and Reference Numeral 32 designates an $n^-$ $In_{0.53}Ga_{0.47}As$ well layer. Alternate repetition of the layers 31 and 32 form a superlattice avalanche multiplication layer. In addition, Reference Numerals 33 and 34 designate a conduction band energy discontinuity amount $\Delta Ec$ and a valence band energy discontinuity amount $\Delta Ev$, respectively. Furthermore, Reference Numerals 33 and 34 show electrons and holes, respectively. Reference Numeral 37 indicates an inter-band tunnel transition within the same well.

In this structure, the conduction band energy discontinuity amount $\Delta Ec$ is 0.5eV which is larger than the valence band energy discontinuity amount $\Delta Ev$ of 0.2eV. Therefore, when the carriers enter in the well 32, the energy acquired due to the band discontinuity is large in the electron 35 than in the hole 36, so that the electron becomes easy to reach an ionization threshold energy. However, the forbidden band width of the well layer in the $In_{0.52}Al_{0.48}As/In_{0.53}Ga_{0.47}As$ superlattice multiplication layer is as small as 0.75eV, and therefore, the tunnel dark current caused by the inter-band tunnel transition 37 within the same well extremely increases to a microampere order or more, in a practical use region in which the multiplication factor is a few times or more, namely, an electric field is 350–400 KV/cm.

On the other hand, in the superlattice structure shown in FIG. 2, the superlattice well layer is formed of a layer that can be equivalently regarded as being a mixed crystal of the two or more kinds of semiconductors because of a short period superlattice structure of the two or more kinds of semiconductors, and therefore, the mini-bands 24 and 25 are formed by the short period structure. As a result, the effective forbidden band width 26 is larger than the forbidden band width 27 in a balk condition of the second kind of semiconductor 23 constituting the well layer. In this structure, therefore, the tunnel dark current caused by the inter-band tunnel transition within the well layer can be exponentially decreased with enlargement of the forbidden band width.

Therefore, if the decrease amount of the conduction band energy discontinuity amount $\Delta Ec$ caused due to the mini-band is made not greater than 0.2eV, since the energy value of the electrons acquired at a heterojunction interface (conduction band energy discontinuity amount $\Delta Ec$) is not remarkably decreased, deterioration of the ionization rate ratio $\alpha/\beta$ and the noise factor is not so remarkable.

Because of the above mentioned function and effect, the structure of the present invention can realize the avalanche photodiode which suppresses generation of the tunnel dark current within the well layer without decreasing or losing the low noise and high speed response characteristics obtained by improvement of the ionization rate ratio $\alpha/\beta$.

Preferably, long periods $L_1$ and $L_2$ of the superlattice structure are not less than 50 Å. The long periods $L_1$ corresponds to the thickness of the barrier layer 14 and the long period $L_2$ corresponds to the thickness of the well layer (short period superlattice composed of first and second kinds of semiconductor). The thickness $L_1$ of the barrier layer 14 of not less than 50 Å is very effective in ensuring that the barrier layer tunneling of electrons does not remarkably appear. The thickness $L_2$ of the well layer of not less than 50 Å is also very effective in ensuring that the energy shift amount (an increase amount) of quantum level is not greater than 0.1eV. Furthermore, as regards short periods $L_3$ and $L_4$ of the well layer, the short period $L_3$ corresponding to the thickness of the barrier layer 15 is preferably not greater than 20 Å, in order to ensure a condition in which the holes in the well layer can remarkably tunnel-transit through the short period barriers 15. However, there is not any specific limitation concerning the short period $L_4$ corresponding to the thickness of the short period well layer 16, other than the requirement that the short period superlattice layer $L_2$ can be equivalently regarded as being a mixed crystal of the two or more kinds of semiconductors.

Now, a manufactured example of the avalanche photodiode in accordance with the present invention will be described. An avalanche photodiode of InAlAs/-$(InAlAs)_m(InGaAs)_n$ in lattice match with InP was manufactured.

First, on an n+ InP substrate 11, there were formed, by a metal organic chemical vapor deposition process in the named order, (1) an n-type InP buffer layer 12 having a thickness of 1 μm, (2) a superlattice multiplication layer 13 having a thickness of 0.5 μm and composed of n− $In_{0.52}AL_{0.48}As$ barrier layers 14 having a carrier concentration of not greater than $1 \times 10^{15} cm^{-3}$ and $(In_{0.52}Al_{0.48}As)_m/(In_{0.53}Ga_{0.47}As)_n$ short period superlattice well layers 15+16 (in the named order), (3) a p+ InP electric field drop layer 17 having a carrier concentration of not greater than $1 \times 10^{17} cm^{-3}$ and having a thickness of 0.2 μm, (4) a $p^{31}$ $In_{0.53}Ga_{0.47}As$ photoabsorption layer 18 having a carrier concentration of not greater than $2 \times 10^{15} cm^{-3}$ and having a thickness of 1.5 μm, and (5) a p+ InP cap layer 19 having a carrier concentration of not greater than $5 \times 10^{18} cm^{-3}$ and having a thickness of 1 μm. Each of the short period superlattice well layers 15+16 was formed in a four-period structure composed of three $In_{0.52}Al_{0.48}As$ layers 15 having a thickness of 10 Å and four $In_{0.53}Ga_{0.47}As$ layers 16 having a thickness of 20 Å, which are alternately stacked. The superlattice multiplication layer 13 was formed in a twelve-period structure obtained by alternately stacking thirteen n− $In_{0.52}Al_{0.48}As$ barrier layers 14 having a thickness of 150 Å and twelve short period superlattice well layers 15+16 as formed above.

Furthermore, the substrate thus deposited was shaped into a mesa form having a diameter of 50 μm by use of a conventional photolithography and wet etching process, and then, an insulating protection layer 112 was deposited. In addition, the p-side electrode 111 was formed of AuZn, and the rear surface of the substrate was polished, so that the n-side electrode 110 was formed of AuGe.

The embodiment thus formed was compared with a conventional example which was formed similarly to the embodiment, other than the fact that the superlattice well layers were formed of a $In_{0.53}Ga_{0.47}As$ layer having the same thickness as that of the embodiment. In the conventional example, when it was biased to give the multiplication factor of 10 at the time of an initial input light 1 μA (wavelength 1.55 μm), the dark current was several 10μA. In the structure of the present invention, however, the dark current was not greater than 0.1 μA, and therefore, remarkable small. As regards the multiplication noise characteristics, the excess noise factor was 4–4.5 dB in both of the embodiment and the conventional example when the incident light has the wavelength of 1.55 μm and the multiplication factor is of 10. Accordingly, a low noise comparable to the effective ionization rate ratio of 10 at maximum was confirmed.

In the conventional example, the noise due to the dark current exceeded the multiplication noise when the multiplication factor is a few times or more. In the structure of the present invention, on the other hand, the noise due to the dark current is negligible in comparison with the multiplication noise. Furthermore, as regards the high frequency characteristics, the maximum band width and the gain bandwidth product were not greater than 9 GHz and not greater than 80 GHz in both of the embodiment and the conventional example.

In the above mentioned embodiment, the superlattice layer has been formed of a combination of n− semiconductors, but can be similarly formed of a combination of p− semiconductors or a combination of high-resistive semiconductors. In addition, the layer thickness of the short period superlattice well layer can be modified dependent upon an electric field applied to the superlattice.

The invention has thus been shown and described with reference to the specific embodiments. However, it should be noted that the present invention is in no way limited to the details of the illustrated structures but changes and modifications may be made within the scope of the appended claims.

I claim:

1. An avalanche photodiode including a multiplication layer and a photoabsorption layer, said multiplication layer being formed of a semiconductor superlattice structure formed of an alternating stacked structure consisting essentially of superlattice barrier layers and short period superlattice well layers said short period superlattice well layers being at least two kinds of semiconductors and being equivalently regarded to be a mixed crystal of said at least two kinds of semiconductors said at least two kinds of semiconductors including a first kind of superconductor constituting a barrier layer in said short period superlattice well layer and a second kind of superconductor constituting a well layer in said short period superlattice well layer.

2. A avalanche photodiode claimed in claim 1 wherein each of said semiconductor barrier layers and said short period superlattice layers has a thickness of not less than 50 Å.

3. A avalanche photodiode claimed in claim 2 wherein each second kind of superconductor has a thickness of not greater than 20 Å.

4. A avalanche photodiode claimed in claim 3 wherein each of said semiconductor barrier layers is formed of an $In_{0.52}Al_{0.48}As$ barrier layer, and said first kind of superconductor is formed of an $In_{0.52}Al_{0.48}As$ layers and a second kind of superconductor is formed of an $In_{0.53}Ga_{0.47}As$ layers.

5. A avalanche photodiode claimed in claim 3 wherein each of said semiconductor barrier layers is formed of an $In_{0.52}Al_{0.48}As$ barrier layer having a thickness of 150 Å, and Each of said short period superlattice layers is formed in a four-period structure composed of three first kind of superconductor layers each formed of an $In_{0.52}Al_{0.48}As$ layers having a thickness of 10 Å and four second kind of superconductor layers each formed of an $In_{0.53}Ga_{0.47}As$ layer having a thickness of 20 Å.

6. An avalanche photodiode including a multiplication layer and a photoabsorption layer, said multiplication layer being formed of a semiconductor superlattice structure formed of an alternating stacked structure consisting essentially of superlattice barrier layers and short period superlattice well layers, each of said superlattice barrier layers and said short period superlattice layers having a thickness of not less than 50 Å, each of said superlattice barrier layers being formed of an InAlAs barrier layer, each of said short period superlattice layers comprising a plurality of first kind of superconductor layers constituting a barrier layer in said short period superlattice layer and a plurality of second kind of superconductor layers constituting a well layer in said short period of superconductor layers, said first kind of superconductor layers and said second kind of superconductor layers being alternately stacked one on another, each of said first kind of superconductor layers being formed of an InAlAs layer, and each of said second kind of superconductor layers being formed of an InGaAs layer having a thickness of not greater than 20 Å.

7. An avalanche photodiode including a multiplication layer and a photoabsorption layer, said multiplication layer being formed of a semiconductor superlattice structure formed of an alternating stacked structure consisting essentially of superlattice barrier layers and short period superlattice well layers, each of said superlattice barrier layers being formed of an $In_{0.52}Al_{0.48}As$ barrier layer having a thickness of 150 Å, each of said short period superlattice layers being formed in a four-period structure comprising three superconductor layers of a first kind, and four superconductor layers of a second kind which are alternatively stacked one on another, each of said first kind of superconductor layers being formed of an $In_{0.52}Al_{0.48}As$ layers having a thickness of 10 Å and each of said second kind of superconductor layers being formed of an $In_{0.53}Ga_{0.47}As$ layer having a thickness of 20 Å.

* * * * *